Figure 1:
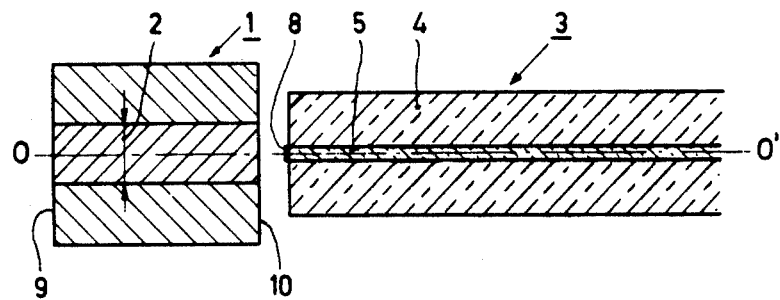

United States Patent [19]

Khoe

[11] 4,143,940
[45] Mar. 13, 1979

[54] DEVICE FOR COUPLING A RADIATION SOURCE TO A MONOMODE OPTICAL TRANSMISSION FIBER WITH THE AID OF A RESONANT CAVITY

[75] Inventor: Giok D. Khoe, Eindhoven, Netherlands

[73] Assignee: U.S. Philips Corporation, New York, N.Y.

[21] Appl. No.: 884,374

[22] Filed: Mar. 7, 1978

Related U.S. Application Data

[63] Continuation of Ser. No. 683,536, May 5, 1976, abandoned.

[30] Foreign Application Priority Data

May 9, 1975 [NL] Netherlands .................. 7505451

[51] Int. Cl.² ............................................ G02B 5/14
[52] U.S. Cl. ........................... 350/96.15; 350/96.18; 331/94.5 C
[58] Field of Search ............. 350/96.17, 96.29, 96.15, 350/96.18; 331/94.5 C

[56] References Cited

U.S. PATENT DOCUMENTS

| | | | |
|---|---|---|---|
| 3,614,661 | 10/1971 | Borner et al. | 350/96.15 |
| 3,877,052 | 4/1975 | Dixon et al. | 350/96.15 |
| 3,897,135 | 7/1975 | Dyott | 350/96.15 |

FOREIGN PATENT DOCUMENTS 1564880  7/1966  Fed. Rep. of Germany ........ 350/96.15

OTHER PUBLICATIONS

L. G. Cohen and M. V. Schneider "Microlenses for Coupling Junction Lasers to Optical Fibers," Applied Optics, vol. 13, No. 1, Jan. 1974, pp. 89-94.

*Primary Examiner*—John K. Corbin
*Assistant Examiner*—Rolf Hille
*Attorney, Agent, or Firm*—Carl P. Steinhauser

[57] ABSTRACT

A device for coupling a radiation source, i.e. a laser resonator to a monomode optical transmission fiber with the aid of a resonant cavity wherein the laser resonator forms part of the resonant cavity and the end of the transmission fiber adjoining the resonant cavity is covered with a reflecting layer at the location of the core.

4 Claims, 4 Drawing Figures

DEVICE FOR COUPLING A RADIATION SOURCE TO A MONOMODE OPTICAL TRANSMISSION FIBER WITH THE AID OF A RESONANT CAVITY

This is a continuation of application Ser. No. 683,536, filed May 5, 1976, now abandoned.

The invention relates to a device for coupling a radiation source in the form of a laser, in particular a semiconductor laser, to a monomode optical transmission fiber with the aid of a resonant cavity.

Such a coupling device is known from German Offenlegungsschrift 1,953,283. In the known device the resonant cavity is passively coupled to the laser resonator. In other words: the resonant cavity does not form part of the structure which influences the frequency and the intensity of the oscillations produced by the laser. In the known device one side wall of the resonant cavity adjoins the laser resonator and the side wall of the resonant cavity opposite said side wall terminates the end of the monomode optical transmission fiber. In the two side walls there is one opening: at the location of the plane where the energy issues from the laser an opening is left in the side wall of the resonant cavity and at the location of the end of the core of the transmission fiber an opening is also left in the associated side wall of the resonant cavity.

The known device has some drawbacks.

One of the side walls of the resonant cavity is disposed at the location of the original laser mirror. The life time of the laser may therefore be adversely affected. Furthermore, laser light is lost which is not coupled into the resonant cavity. This happens if the laser starts to oscillate mainly in higher-order transversal modes. The cross-section of each of the higher-order transversal modes is greater than that of the lower-order transversal modes, in particular that of the zero-order mode. These higher modes cannot pass the entrance opening of the resonant cavity. Finally, the parameters of the laser sub-beams cannot be adapted (In this respect reference is made to the theoretical analysis about the coupling between optical modes by H. Kogelnik: "Coupling and conversion coefficients for optical modes", in Proceedings Symposium on Quasi-Optics, 1964, pages 333–347. From this analysis the following conclusions may be drawn: High coupling efficiencies can be achieved in the case of coupling between the lowest transversal optical modes, namely if the dimensions of these modes in respect of cross-section and divergence are adapted to each other. The mutual distance between the optical components is also an important parameter: the coupling efficiency generally decreases quadratically with increasing distance, except for very small distances of the order of some wavelengths. Finally, the analysis reveals that the maximum coupling efficiency between a higher-order transversal optical mode and the lowest-order transversal optical mode is substantially lower than the efficiency in the case of coupling between the lowest-order transversal optical modes mutually).

It is an object of the invention to mitigate the above-mentioned drawbacks. Therefore it is characterized in that the laser resonator forms part of the resonant cavity and that the end of the monomode optical transmission fiber which adjoins the resonant cavity is covered with a reflecting layer at the location of the core.

It is to be noted that applying a reflecting layer on the core of an optical fiber is known from U.S. Pat. No. 3,897,135. In the known coupling device, however, one of the mirrors of the laser resonator is provided with an anti-reflection layer, so that the laser action of the laser is destroyed. The laser action is restored by arranging the end-face of the fiber which is provided with a reflection layer just before the anti-reflection layer. Thus, the known laser operates only if it is coupled to such a fiber. Furthermore, such an anti-reflection layer (generally speaking, any adaptation of the laser) will adversely affect the life time of the laser.

The device in accordance with the invention has a high coupling efficiency for the lowest-order optical modes. For this purpose, the distance between the laser and the fiber is minimized and in accordance with a characteristic feature of the invention the divergence of the laser beam is corrected with a micro-lens at the end of the core of the fiber, said end being flattened and having an elliptical cross-section.

In the device in accordance with the invention the low-loss reflecting layer applied to the core of the fiber is utilized as a means of stimulating the lowest-order transversal mode for the laser. This order is characterized by the presence of only one intensity maximum on the mirror, namely on the optical axis of the laser. Higher-order transversal modes have more intensity maxima on the mirror and, moreover, their total cross-section is greater than that of the lowest-order transversal mode. On the laser mirrors the higher-orders consequently cover a substantial area of the surface, while the lowest-order utilizes only a small area around the optical axis of the mirrors.

When the reflection coefficient of at least one of the laser mirrors is locally increased in this small area, only the lowest-order transversal mode is stimulated, because this area is too small to influence the higher-order transversal modes. The local increase of the reflection coefficient of the relevant laser mirror can be realized by arranging the fiber core with the reflecting layer on the core just before said laser mirror, namely exactly on the optical axis of the laser. The fiber core for example has a diameter of 3 microns, so that the reflecting layer on the core will also have a diameter of 3 microns. This diameter is substantially smaller than the area on the laser mirror which is utilized by the higher-order transversal modes of the laser. The last-mentioned area is generally 15 to 20 microns in the direction of the semiconductor layers. The direction transverse to the semiconductor layers is left out of consideration, since there always the lowest-order transversal mode must be radiated under the influence of the thin active area which does not allow any higher orders.

Figure 2A:
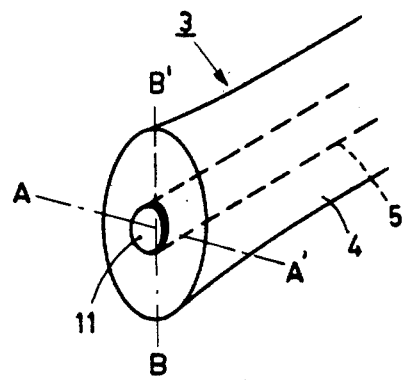
Figure 2B:
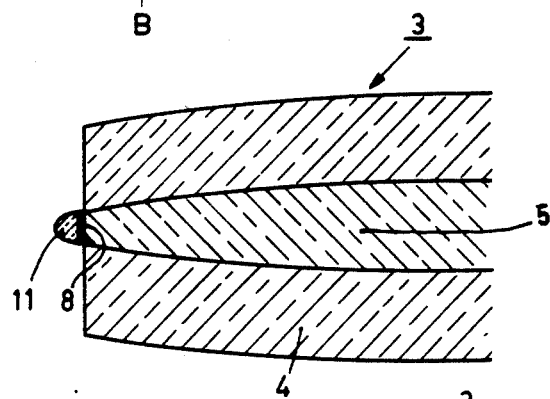
Figure 2C:
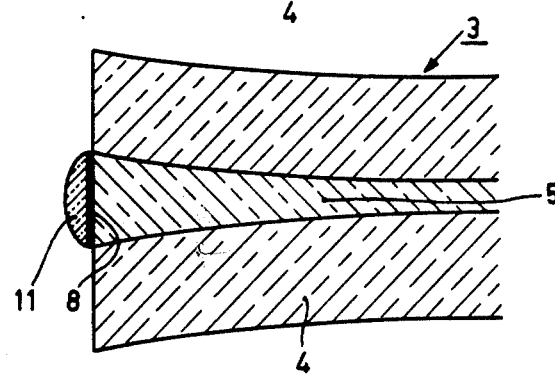

The invention will be described in more detail by way of example with reference to the drawing, in which FIG. 1 shows a device in accordance with the invention, and FIGS. 2a through 2c shows a detail of a device in accordance with the invention.

In FIG. 1 a semiconductor laser is designated 1. The laser mirrors which are obtained by the semiconductor material-to-air transition are designated 9 and 10 respectively. The optical fiber 3 has a sleeve 4 and a core 5. The reflecting layer at the end-face of the core 5 is designated 8.

The width 2 of the electrical contact ("stripe") on the laser 1 more or less determines the width of the effective active layer of the laser and this width finally determines the total width of higher-order optical modes which emerge from the laser mirrors 9 and 10. The width 2 lies between approx. 15 and 20 microns, while the diameter of the core is approximately 3 microns. From the intermediate area of the width 2 the lowest order transversal mode will emerge. In addition to reflection at the transition 10, said mode will also be reflected at the reflecting layer 8.

Higher-order transversal modes will generally emerge from the mirrors 9 and 10 over the entire width 2 of the stripe and will hardly be influenced by the mirror 8. The losses are not greater than in the case of a laser by itself, because the mirrors 9 and 10 are still in tact. The laser will be stimulated to operate in a fundamental mode, namely in a reactive manner and non-resistively.

A simple method of obtaining the mirror 8 on the core 5 is the following. The fiber end is covered by a positive photoresist, the photoresist is exposed via the core 5, developed, a reflecting layer is vacuum-deposited (for example a layer of titanium oxide with a thickness of a quarter wavelength), and subsequently the positive photo-resist is removed and at the same time the reflecting layer on the positive photo-resist.

In the device of FIG. 1 a high coupling efficiency is obtained between the lower-order optical modes, if no additional auxiliary components at all are used. The coupling efficiency may be increased even further by additional means. As the laser beam in the fundamental mode is slightly elliptical in cross-section, an increase of the coupling efficiency can be achieved by slightly flattening the fiber 3 after heating, in such a way that the end of the core 5 becomes elliptical. Of course, care must be taken that the major axis of the ellipse remains smaller than the width 2 of the stripe. This is because the mode-selective effect of the mirror 8 on the core 5 should not be lost.

The coupling efficiency may be further increased by for example applying a thick layer of a negative photo-resist on the flattened end face of the fiber 3. After exposure via the core 5 and development, a lens 11 (FIGS. 2b and 2c) will be obtained, which has the shape of a semiellipsoid. This lens 11 will have a correcting effect on the asymmetrical divergence of the laser beam. This divergence is approx. 10 degrees parallel to the stripe 2 and between approx. 30 and 50 degrees perpendicular thereto.

FIG. 2a shows the additional means. FIG. 2b is the cross-section AA' through the end face of the fiber 3 and FIG. 2c is the cross-section BB' through the end face of the fiber 3. AA' and BB' are respectively parallel to the major axis and the minor axis of the elliptical cross-section of the end face 8.

What is claimed is:

1. In combination, a laser radiation source having a resonant cavity bounded by oppositely disposed mirrors defining an optical axis, a monomode optical transmission fiber having a light transmissive core axially aligned with the optical axis of the laser radiation source, and a reflecting layer on the optical axis of the laser covering the core of the end of the monomode optical transmission fiber which adjoins one mirrored end of the resonant cavity for stimulating the lowest-order transveral mode for the laser radiation source.

2. A device as claimed in claim 1, wherein the end of the transmission fiber which adjoins the resonant cavity is monotonously flattened, so that the end of the core has an elliptical cross-section.

3. A device as claimed in claim 2, wherein a lens having the form of a semi-ellipsoid is disposed on the end of the core.

4. A device as claimed in claim 1, wherein opposite each of the laser mirrors a transmission fiber is disposed and the resonant cavity is formed by the space between the ends of said transmission fibers.

* * * * *